(12) United States Patent
Liu

(10) Patent No.: US 6,405,739 B1
(45) Date of Patent: Jun. 18, 2002

(54) SPIN CHUCK CAPABLE OF PROVIDING SIMULTANEOUS DUAL-SIDED PROCESSING

(76) Inventor: Yu-tsai Liu, No. 45-2, 5 Lin, Shang Shan Tsun, Chiung Lin Village, Hsinchu County (TW)

( * ) Notice: Subject to any disclaimer, the term of this patent is extended or adjusted under 35 U.S.C. 154(b) by 0 days.

(21) Appl. No.: 09/560,712

(22) Filed: Apr. 27, 2000

(30) Foreign Application Priority Data

Nov. 9, 1999 (TW) .......................................... 88119699

(51) Int. Cl.[7] .................................................. B08B 3/02
(52) U.S. Cl. ...................... 134/149; 134/157; 134/153; 134/902
(58) Field of Search ................................. 134/137, 149, 134/153, 157, 902

(56) References Cited

U.S. PATENT DOCUMENTS 5,357,645 A * 10/1994 Onodera
5,916,366 A * 6/1999 Ueyama et al.
5,988,191 A * 11/1999 Duncan

FOREIGN PATENT DOCUMENTS

| JP | 2-197126 | * | 8/1990 | .................. 134/902 |
| JP | 5-3184 | * | 1/1993 | .................. 134/902 |

* cited by examiner

Primary Examiner—Frankie L. Stinson
(74) Attorney, Agent, or Firm—Baker & Daniels

(57) ABSTRACT

A spin chuck using at least three clamping rollers for clamping a substrate during the rotation of the substrate. The clamping rollers are driven by a planetary gear transmission mechanism that is on a rotatable body. The final rotation speed of the substrate is determined by the cooperation of the rotation speeds of the clamping rollers and the body. The spin chuck is capable of providing simultaneous dual-sided processing, and the angular velocity and angular acceleration of the spin chuck have a wide range of adjustment.

6 Claims, 12 Drawing Sheets

SPIN CHUCK CAPABLE OF PROVIDING SIMULTANEOUS DUAL-SIDED PROCESSING

FIELD OF THE INVENTION

The invention relates to a spin chuck used in a chamber, in particular, to a spin chuck capable of providing simultaneous dual-sided processing (including cleaning processes), and capable of widely adjusting the angular velocity and angular acceleration thereof.

BACKGROUND OF THE INVENTION

In a conventional manufacturing process of a semiconductor device or a liquid crystal display (LCD) including wet etching, cleaning, wet spin etching, coating, and developing, various types of acid tanks or chambers are utilized. In a conventional chamber, a wafer or LCD substrate is clamped on a chuck that is driven to rotate by a driving device (e.g. a motor).

A conventional driving system utilizes a single motor as a driving source. A wafer clamped on a chuck is driven to rotate as shown in U.S. Pat. No. 5,312,487.

Referring to FIG. 1, a conventional driving system of a spin chuck for driving a substrate 101 to rotate includes a motor 102, a chuck 104, and a controller 105. The motor 102 includes a rotating shaft 103. The rotating shaft 103 drives the chuck 104, used to clamp a substrate 101, to rotate. The controller 105 is used for controlling the angular velocity of the motor 102. The substrate 101 is clamped on the chuck 104 by way of vacuum pressure. Therefore, the driving system further includes a vacuuming conduit 106 penetrating through the motor 102.

In the driving system, the chuck 104 is driven by the motor 102 to rotate substrate 101. The end product of the complicated processes substrate 101 undergoes is determined by the properties of the processing materials, the patterns on the substrate 101, the angular velocity control and the angular acceleration control of the substrate 101, among others. After the processing materials and the patterns on the substrate 101 are determined, control over both angular velocity and angular acceleration of the substrate 101 becomes an important issue.

Referring to FIG. 2, the horizontal axis represents time, and the vertical axis represents the rotation speed of the substrate. Time t is the time required for the substrate to increase its rotation speed from 0 to N (where N is an integer) rpm (revolutions per minute). A line 107 represents the speed variation of the substrate. Time t is also the time required for the substrate to decrease its speed from 0 to −N rpm. A line 108 represents the speed variation of the substrate. The maximum rotation speed of the substrate is N or −N rpm.

A line 109 represents the rotation speed of the substrate after it reaches N rpm, while a line 110 represents the rotation speed of the substrate after it reaches −N rpm. An area 111 shaded with diagonal lines is the speed variation of the substrate. The maximum angular acceleration of the substrate can be determined from the slopes of lines 107 and 108.

In general, variations in the angular velocity and the angular acceleration of the motor 102, which drives the substrate 101, are ideally as large as possible. However, after the motor 102 is manufactured, the performance (e.g., the maximum instant torque, the maximum rotating speed, the minimum rated rotating speed, the maximum angular acceleration, and related characteristics) of the motor 102 and those of the controller 105 are fixed. When the motor 102 is designed for rotating at high speeds, its rotation condition is not stable or easily controlled at low rotation speeds. In addition, when the motor 102 is designed for rotating at low rotation speeds, its rotation condition is not stable or easily controlled at high rotation speeds.

Recently, the line widths of semiconductor products have greatly decreased. More time is needed for the processing material to fill into the narrow trenches and cover the surfaces of the trenches. After the processing material has filled into the narrow trenches, the redundant processing material cannot be ejected from the trenches due to the surface tension of the processing material. In order to avoid this phenomenon, the driving system has to provide greater angular velocity or angular acceleration to force out the redundant processing material in the trenches.

The design of the motor 102 or controller 105 can be improved to let the angular velocity and the angular acceleration of the motor 102 satisfy the process requirements. However, it is extremely difficult for a single set of one motor 102 and one controller 105 to reach wide controls of angular velocity and angular acceleration, unless the manufacturing costs of the motor 102 and the controller 105 are increased. Even then, a motor 102 and a controller 105 are often unable to satisfy the process requirements.

In a conventional spin chuck driving system, a motor is in direct contact with a chuck. Thus, the heat energy generated from the motor is easily transferred to the chuck, causing the substrate temperature to rise. Furthermore, since the tangential velocity of the circumferential edge of the rotating substrate relative to the air is high, the heat energy at the circumferential edge of the substrate is easily transferred to the air. In addition, since the tangential velocity at the center of the rotating substrate relative to the air is low, the heat energy at the center of the substrate is not easily transferred to the air. As a result, a temperature difference between the circumferential edge and the center of the substrate is induced, which deteriorates the qualities of product.

FIG. 3A is a front cross-sectional view illustrating a flow status of an etchant on a substrate in a conventional etching process. FIG. 3B is a top view illustrating a flow status of an etchant on a substrate in a conventional etching process. FIG. 3C is a front cross-sectional view illustrating the etched substrate as shown in FIG. 3A. FIG. 3D is a top view illustrating the etched substrate as shown in FIG. 3B.

Referring to FIGS. 3A and 3B, an etchant 121 flows through a trench 123 of a substrate 122. An arrow indicates the direction of flow of the etchant 121. In the prior art, the direction of flow of the etchant 121 is fixed because the rotation direction of the substrate 122 is fixed. FIGS. 3C and 3D show the change in the trench patterns and the deteriorating quality of the substrate from the etching process.

In order to prevent the lower surfaces of the wafers or LCD substrates from having direct contact with a spin chuck, a spin chuck using a protective layer of gas and a clamp pin, as disclosed in U.S. Pat. No. 5,421,056, is used. A schematic illustration of the above spin chuck is shown in FIG. 4A.

Referring to FIG. 4A, the spin chuck 141 has six clamp pins 142. The clamp pins 142, that clamp or release substrate 140, form a ring that is adjusted by an extension rod (not shown) and a swingable lever. A supply passage 143 is provided within the spin chuck 141 to support the substrate 140 using a flow of gas. It should be noted that the arrow indicates the gas's direction of flow.

The substrate 140 is not in direct contact with the spin chuck 141, solving substrate 140's lower surface pollution problem. However, because there is no relative motion between each of the clamp pins 142 and the substrate 140, unwanted pin marks 144 are easily formed in the contact regions between each of the clamp pins 140 and the substrate 140, as shown in FIG. 4B. Therefore, uniform product quality is not easily obtained.

SUMMARY OF THE INVENTION

It is therefore an object of the invention to provide a spin chuck capable of providing simultaneous dual-sided processing (including cleaning processes), wide ranges of angular velocity and angular acceleration, and uniform substrate quality. The spin chuck in accordance with the invention can rotatably clamp the outer periphery of the substrate so as to provide simultaneous dual-sided processing.

In accordance with an aspect of the invention, a spin chuck used for clamping a substrate to rotate in a chamber includes three roller shafts and three clamping rollers. The respective roller shafts are driven to rotate by a planetary gear transmission mechanism. The planetary gear transmission mechanism includes a gear shaft driven to rotate by a driving device, and three output shafts. The rotation speed of each of the three output shafts has a predetermined relationship with the rotation speed of the gear shaft so as to drive each of the three respective roller shafts to rotate. The three clamping rollers are fixed on the three roller shafts, and are driven to rotate by each of the three respective roller shafts so as to rotatably clamp the substrate.

In accordance with another aspect of the invention, a spin chuck used for clamping a substrate to rotate in a chamber includes a body, an input/output conduit, a gear shaft, two conoids, a frame, a planetary gear transmission mechanism, three roller shafts, and three clamping rollers.

The body is driven to rotate by a driving device, the body has a through hole penetrating through the body, a first space substantially perpendicular and communicating with the through hole, three holes allowing the first space to communicate with the outside, a plurality of upper guiding portions communicating with the first space and located above the first space, and a plurality of lower guiding portions communicating with the first space and located below the first space.

The input/output conduit penetrates through the through hole and is for supplying a predetermined processing material to the substrate and for allowing a predetermined processing material drain out.

The gear shaft is received in the through hole and rotatably mounted between the body and the input/output conduit. The two conoids are rotatably mounted on the gear shaft and each conoid is separated from the other by a predetermined distance. Each of the conoids has a plurality of slanting guiding portions.

The frame is received in the body and includes a plurality of section-shaped sub-frames. Each of the sub-frames has a gear-room, and an upper sliding portion and a lower sliding portion. The upper and lower sliding portions are located above and under each sub-frame's respective gear-room. The upper sliding portion shifts within the upper guiding portion, while the lower sliding portion shifts within the lower guiding portion.

Each of the sub-frames further includes an upper shifting portion and a lower shifting portion located at the inner periphery of the sub-frame and spanning from the top to the bottom which allows shifting within the slanting guiding portion while the frame is being enlarged and reduced by the two conoids and the plurality of slanting guiding portions.

The planetary gear transmission mechanism is received in the gear-room, it includes a sun gear, three planet gears, and three output shafts. The sun gear is fixed on the gear shaft between the two conoids with the gear shaft serving as a rotating shaft. The three planet gears are arranged around the sun gear. The three output shafts are fixed on the three planet gears and penetrate through the frame.

The three roller shafts are received within the gear shafts and driven to rotate by the three output shafts. The three clamping rollers are mounted to the three roller shafts to rotate and rotatably clamp the substrate.

DETAILED DESCRIPTION OF THE PREFERRED EMBODIMENTS

The preferred embodiments will be described with reference to the accompanying drawings.

Figure 5:
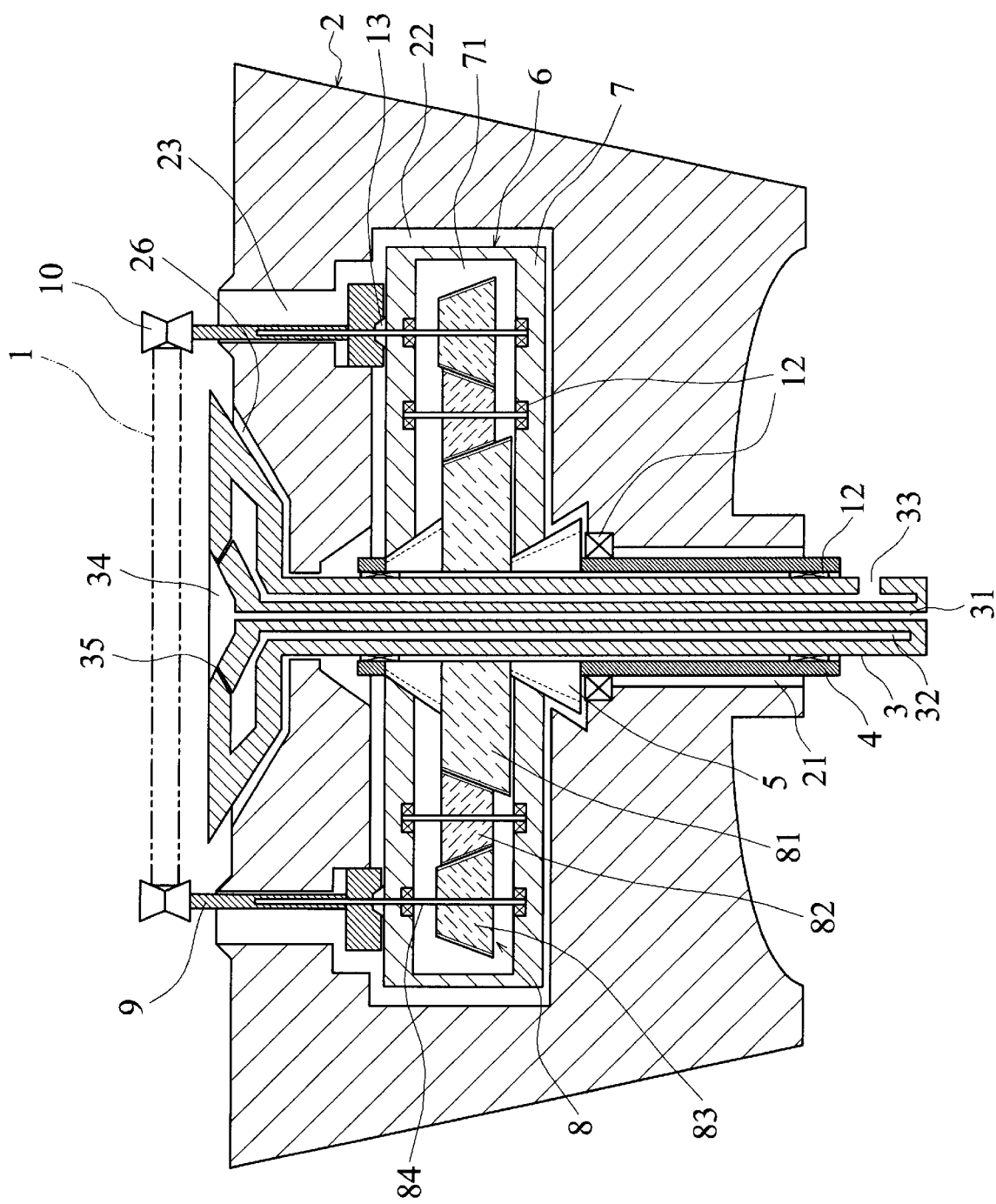
FIG. 5 is a schematic illustration showing a spin chuck in accordance with a preferred embodiment of the invention.

Referring to FIG. 5, a spin chuck is used for clamping a substrate 1 (e.g. a wafer or LCD substrate) during rotation of the substrate 1. The spin chuck includes a body 2, an input/output conduit 3, a gear shaft 4, two conoids 5, a frame 6, a planetary gear transmission mechanism 8, six roller shafts 9, and six clamping rollers 10.

The body 2 is driven to rotate by a first driving device (e.g. a motor) that is not shown.

The input/output conduit 3 is used for supplying a predetermined processing material (e.g. a cleaner or etchant) to the substrate 1, or draining out unwanted processing material.

The gear shaft 4 is driven to rotate by a second driving device (e.g. a motor) that is not shown.

The frame 6, which includes three section-shaped sub-frames 7, is capable of enlarging or reducing its diameter.

The gear shaft 4 drives the planetary gear transmission mechanism 8.

A corresponding output shaft 84 of the planetary gear transmission mechanism 8 drives each of the roller shafts 9.

Each of the clamping rollers 10 is fixed on a corresponding roller shaft 9 and rotatably clamps the substrate 1.

The input/output conduit 3 penetrates through the body 2. The hollow gear shaft 4 is placed between the input/output conduit 3 and the body 2. A plurality of bearings 12 is provided between the gear shaft 4 and the body 2, and between the gear shaft 4 and the input/output conduit 3. Therefore, the gear shaft 4 can rotate independently of the body 2 and the input/output conduit 3.

The planetary gear transmission mechanism 8 includes a sun gear 81, three planet gears 82, six planet gears 83, and six output shafts 84.

The sun gear 81 is fixed to the gear shaft 4 and located between the two conoids 5. The gear shaft 4 serves as the rotating shaft of the sun gear 81. The planet gears 82 mesh with the sun gear 81. The six planet gears 83 mesh with the three sun gears 81. Two adjacent planet gears 83 are one set. Each of the output shafts 84 is fixed to the corresponding outermost planet gear 83 and projects over the sub-frame 7.

Six roller shafts 9 are driven to rotate by their six respective output shafts 84.

Six clamping rollers 10 are fixed on their respective roller shafts 9 so as to rotatably clamp the substrate 1.

The structure of each of the other elements will be described in detail with reference to FIGS. 6 to 9.

Figure 6:
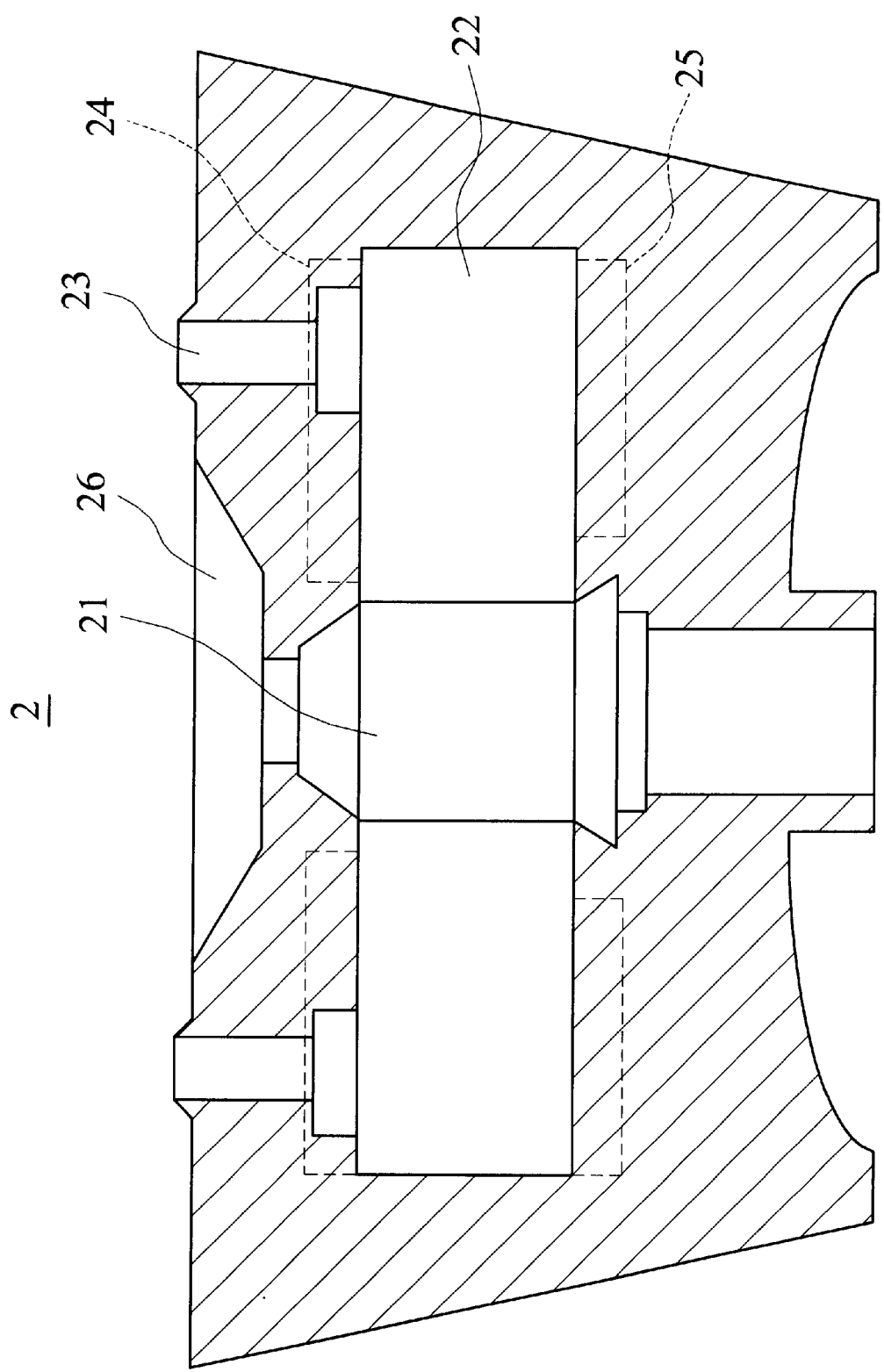
FIG. 6 is a schematic illustration showing the body of the spin chuck as shown in FIG. 5.

Referring to FIG. 6, the body 2 has a through hole 21, a first space 22, six holes 23, three upper guiding portions 24, three lower guiding portions 25, and a second space 26.

The through hole 21 penetrates through the body 2. The first space 22 vertically communicates with the through hole 21. The holes 23 communicate with the first space 22 and with the outside. The upper guiding portions 24 communicate with the first space 22 and are located above the first space 22. The lower guiding portions 25 communicate with the first space 22 and are located under the first space 22. The second space 26 communicates with the through hole 21 and with the outside.

Figure 7:
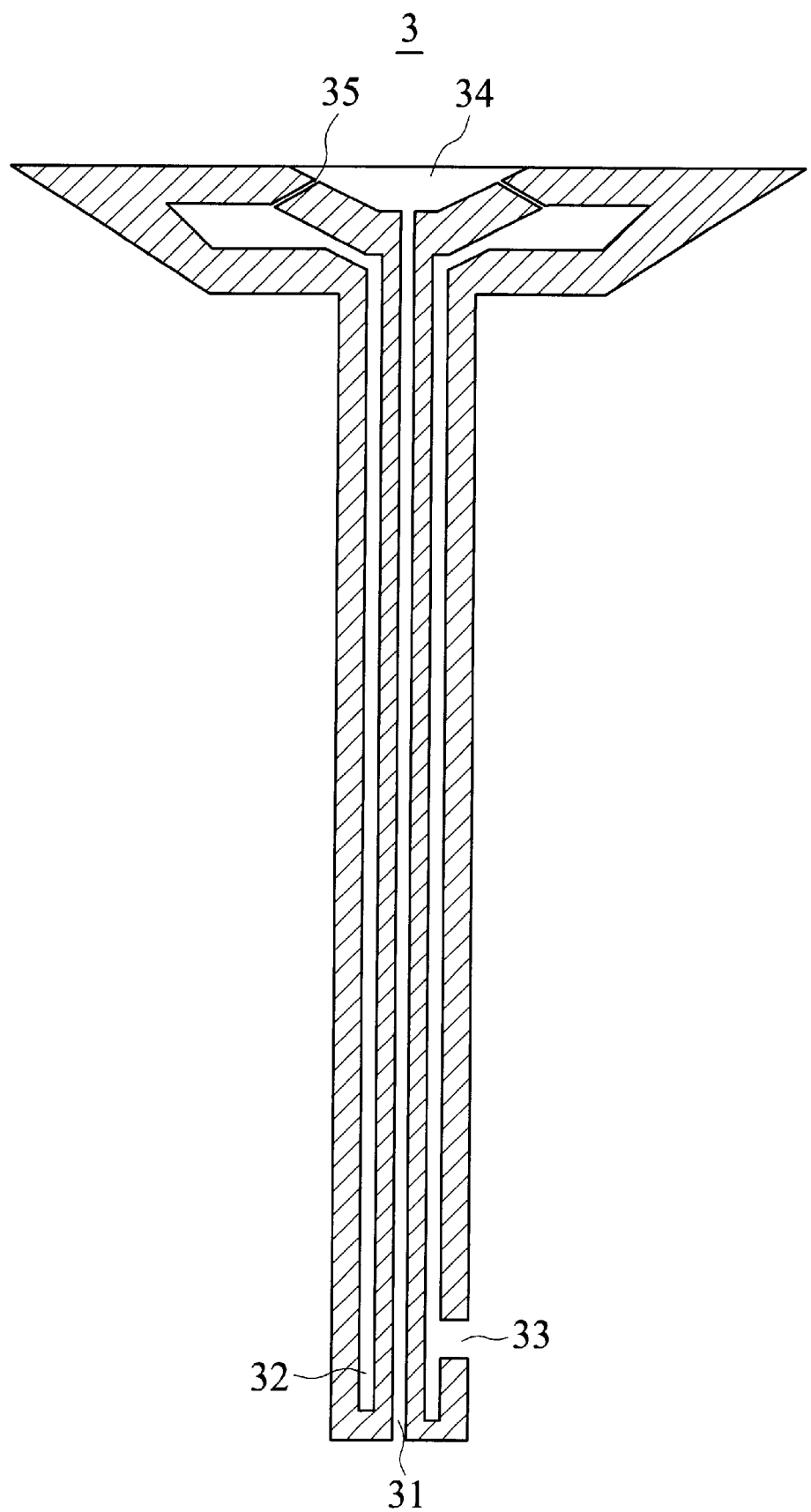
FIG. 7 is a schematic illustration showing the input/output conduit as shown in FIG. 5.

Referring to FIG. 7, the input/output conduit 3 includes an output conduit 31, an input conduit 32, and a collecting portion 34. The output conduit 31 penetrates through the input/output conduit 3. The input conduit 32 has an inlet 33 and six outlets 35. The six outlets 35 are allocated around the output conduit 31. The inlet 33 is used for inputting a predetermined processing material. The outlets 35 are used for spraying the predetermined processing material on the lower surface of the substrate to be treated. The collecting portion 34 communicates with the output conduit 31 and the input conduit 32 collects the processing material to be drained.

Figure 8A:
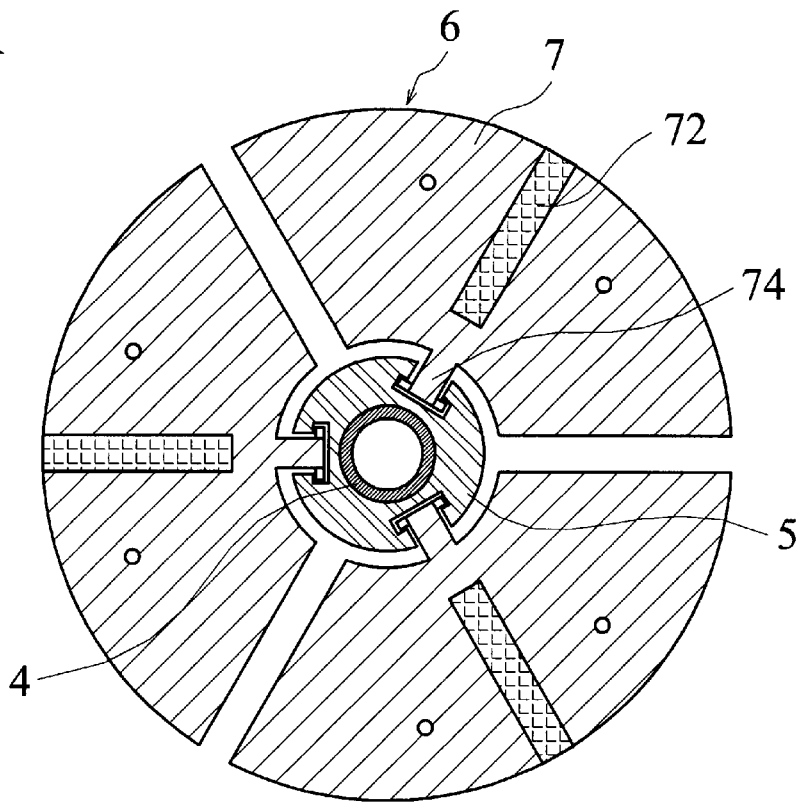
FIG. 8A is a top view illustrating an arrangement of a frame, a conoid, and a gear shaft.
Figure 8B:
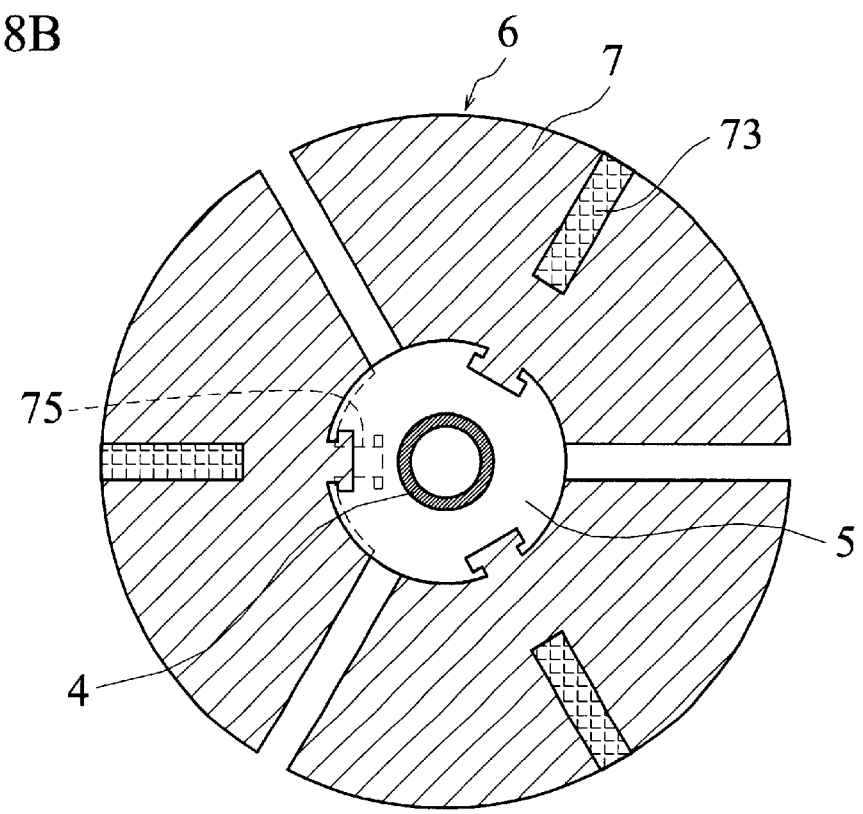
FIG. 8B is a bottom view illustrating an arrangement of a frame, a conoid, and a gear shaft.

Referring now to FIGS. 8A and 8B, the frame 6 is composed of three sub-frames 7. An upper sliding portion 72 and a lower sliding portion 73 are above and under each of the sub-frames 7, respectively. An upper shifting portion 74 and a lower shifting portion 75 are at the inner periphery of each of the sub-frames 7. Furthermore, it is understood from FIG. 5 that each of the sub-frames 7 is a hollow structure for receiving the planetary gear transmission mechanism 8. The receiving space is referred to as a gear-room 71.

Figure 9A:
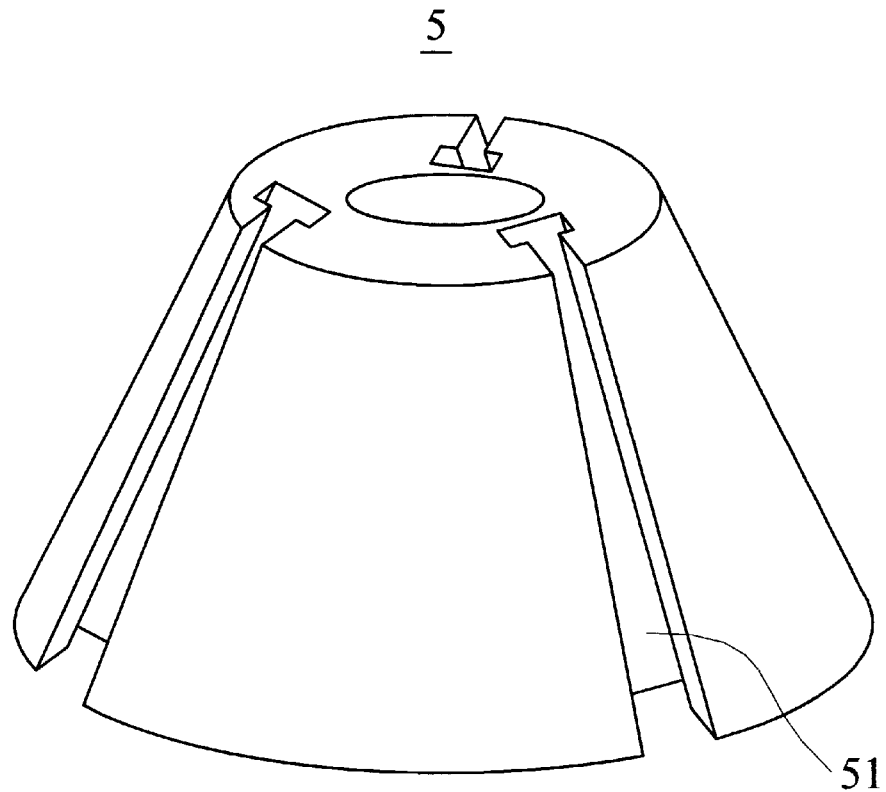
FIG. 9A is a pictorial view of the conoid as shown in FIG. 5.
Figure 9B:
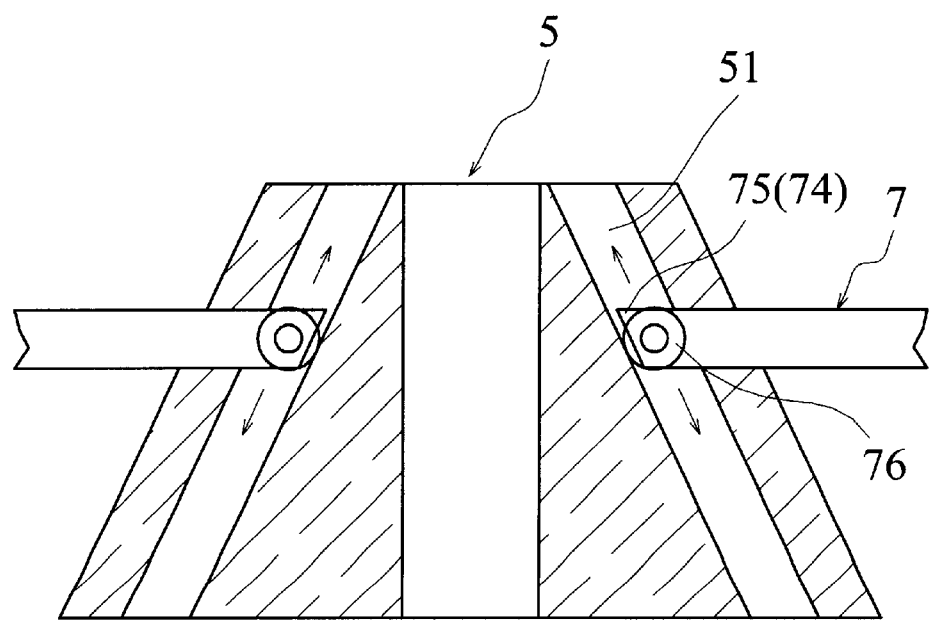
FIG. 9B is a schematic illustration showing the relative motion between the conoid and the sub-frame as shown in FIG. 5.

Referring to FIGS. 9A and 9B, the conoid 5 has three slanting guiding portions 51. Pulleys 76 are mounted on each of the upper shifting portions 74 of the sub-frames 7 and each of the lower shifting portions 75 of the sub-frames 7. Three slanting guiding portions 51 allow the pulleys 76 to slide within the slanting guiding portions 51 (the arrows indicate the directions to which the pulleys 76 can slide). The slanting guiding portions 51 are T-slots of the embodiment. Thus, the pulleys 76 are always in contact with the slanting guiding portion 51. The conoids 5 are rotatably mounted on the gear shaft 4. The sun gear 81 is not fixed to the two conoids 5. The frame 6 can move with respect to the conoids 5. The pulleys 76 can slide down when pushing up the gear shaft 4 and the pulleys 76 can slide up when pulling down the gear shaft 4.

The diameter of the frame 6 can be enlarged or decreased as described in the following.

Figure 10A:
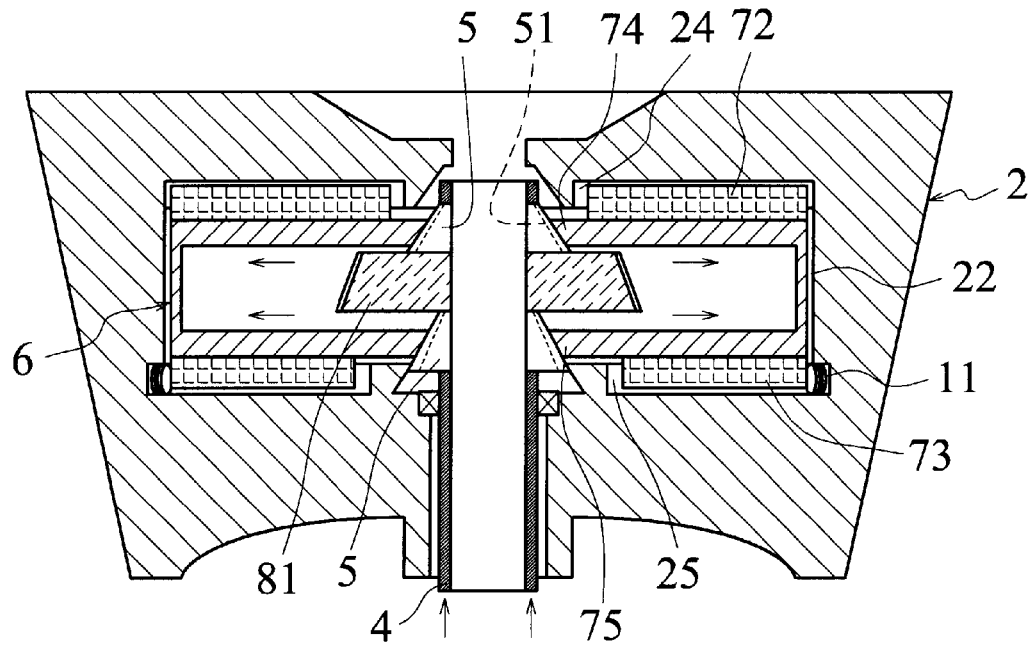
FIG. 10A is a schematic illustration showing the relative motion between the frame and the body when pushing the gear shaft up.

Referring to FIG. 10A, when the gear shaft 4 is pushed up as indicated by the vertical arrows, the upper shifting portions 74 and the lower shifting portions 75 slide downwards along the slanting guiding portions 51 of the conoids 5 since the upper sliding portions 72 are guided by the upper guiding portions 24. Furthermore, the upper shifting portions 74 and the lower shifting portions 75 slide downwards and outwards (as indicated by the horizontal arrows) due to the slope of each of the slanting guiding portions 51. The frame 6 can stably enlarge its diameter by with the guidance and limitations imposed on it by the upper guiding portions 24 and its corresponding upper sliding portion 72 and by each of the lower guiding portions 25 and its corresponding lower sliding portion 73. Enlarging frame 6 compresses the three springs 11 located at the lower guiding portions 25.

Figure 10B:
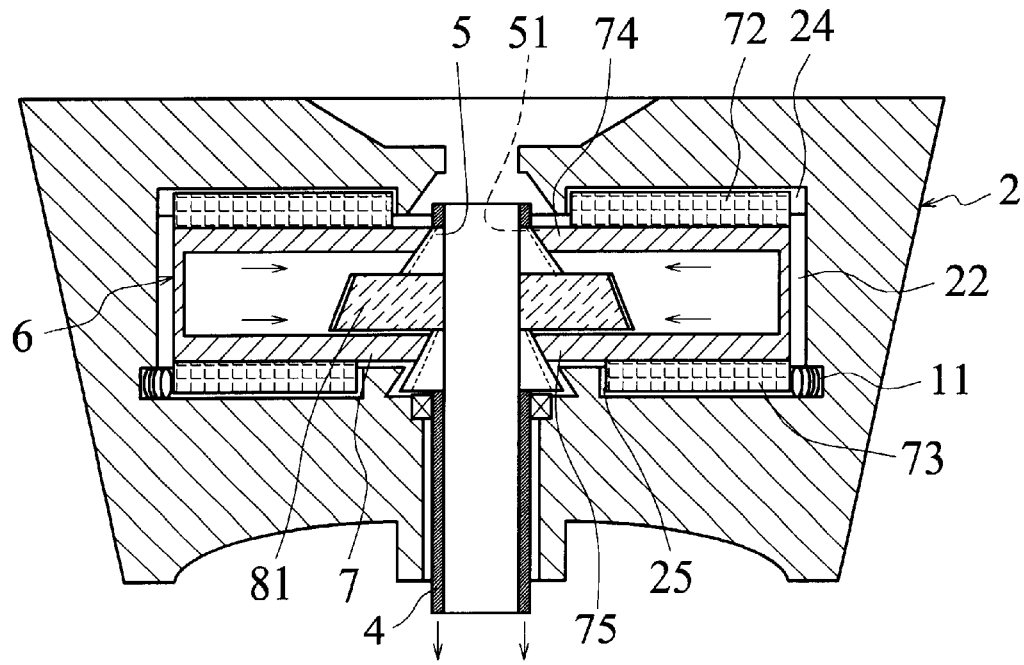
FIG. 10B is a schematic illustration showing the relative motion between the frame and the body when not pushing the gear shaft up.

Similarly, referring to FIG. 10B, when the gear shaft 4 is pulled down as indicated by the vertical arrows, the upper shifting portions 74 and the lower shifting portions 75 slide upwards and inwards (as indicated by the horizontal arrows), along the slanting guiding portions 51 of the conoids 5. Thus, the diameter of the frame 6 is decreased. It should be noted that the springs 11 exerts an assistant force that assists in clamping the substrate 1.

Referring again to FIG. 5, when frame 6 enlarges its diameter, both the output shafts 84 and the clamping rollers 10 shift outwards enlarging the region enclosed by them and unloading the substrate 1. When frame 6 decreases its diameter, both the output shafts 84 and the clamping rollers 10 shift inwards decreasing the region enclosed by them and clamping the substrate 1.

Six guiding blocks 13 are set at the intersections of each of the output shafts 84 and the frame 6 to prevent the processing material (e.g. a cleaner or etchant) from flowing into the planetary gear transmission mechanism 8 along the roller shafts 9 and the output shafts 84.

Figure 11:
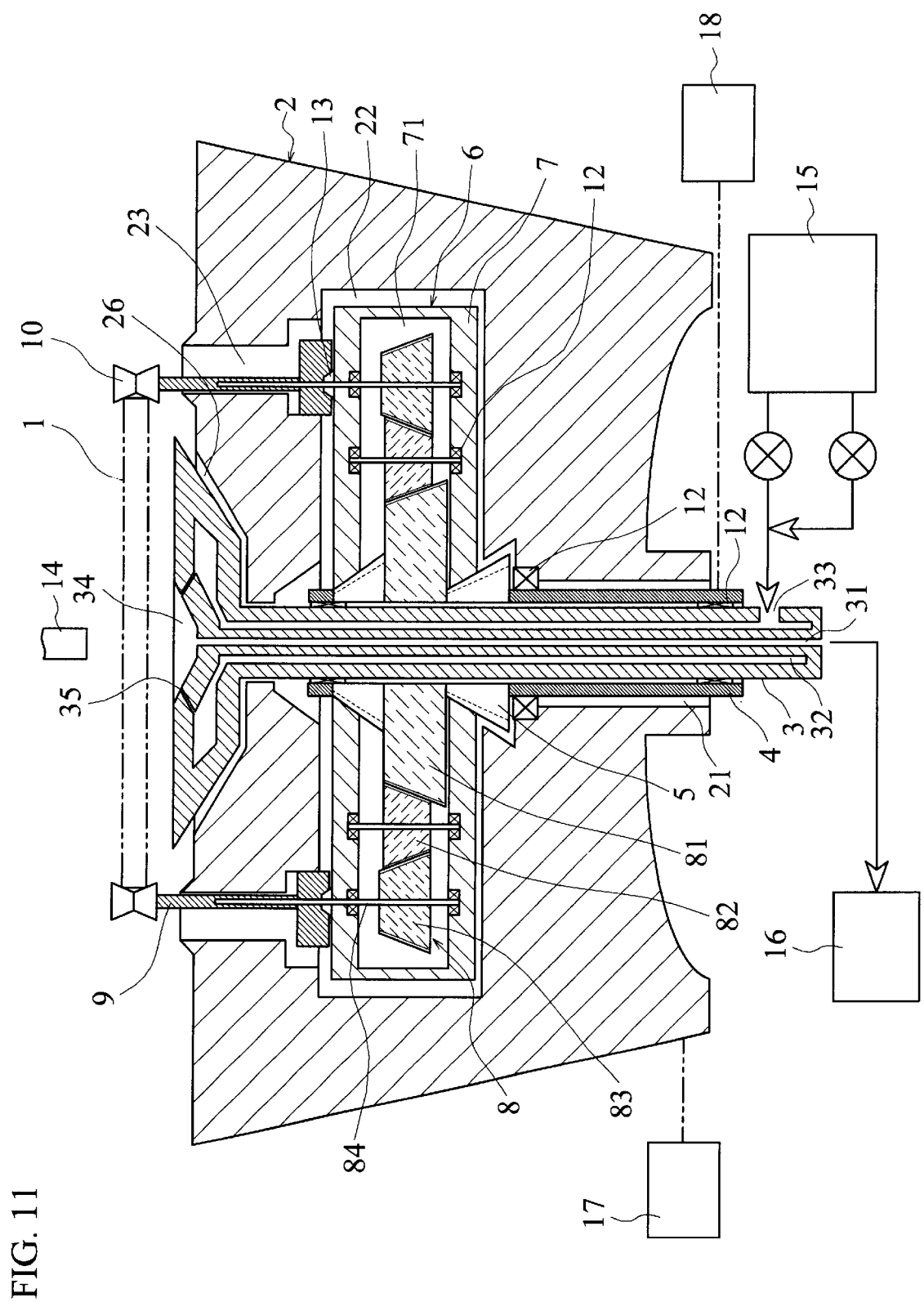
FIG. 11 is a schematic illustration showing the arrangement of an operating spin chuck in accordance with the invention.

Referring to FIG. 11, in addition to the spin chuck, there is a nozzle 14 above the spin chuck to supply a predetermined processing material onto the substrate 1. Furthermore, a material supplying device 15 is selectively communicated with the inlet 33 of the input/output conduit 3 to supply cleaner, etchant, or nitrogen to the lower surface via the input conduit 32 and the outlets 35. Moreover, to drain away the unwanted processing material the output conduit 31 is connected to a waste-liquid tank 16. The body 2 is driven to rotate by a first motor 17. The gear shaft 4 is driven to rotate by a second motor 18 and is biased up and down by a push rod (not shown).

The operation of the spin chuck in accordance with the above embodiment of the invention is described in the following.

First, when no substrate 1 is clamped on the spin chuck, unwanted processing material is sprayed out by nozzle 14. The unwanted processing material can be drained into the waste-liquid tank 16 via the collecting portion 34 and the output conduit 31.

Next, the gear shaft 4 is biased up by the push rod, and the region enclosed by the six clamping rollers 10 is enlarged. The substrate 1 is then transferred to a predetermined position. Thereafter, the gear shaft 4 is biased down by the push rod. At this time, the frame 6 shrinks, and the region enclosed by the six clamping rollers 10 decreases to clamp the substrate 1.

When the first motor 17 drives the body 2 to rotate and the second motor 18 halts, the substrate 1 will rotate. In this case, a processing material can be supplied to the upper surface of the substrate 1 via the nozzle 14, and another processing material (e.g. a cleaner or etchant) can also be supplied to the lower surface of the substrate 1 from the material supplying device 15.

When the second motor 18 drives the gear shaft 4 to rotate and the first motor 17 halts, the sun gear 81 is driven to rotate by the gear shaft 4, while the two conoids 5 are not driven to rotate. In this case, the planet gears 82 are driven to rotate by the sun gear 81; the planet gears 83 and the output shafts 84 are driven by the planet gears 82; and the roller shafts 9 and the clamping rollers 10 are driven to rotate by the output shaft 84. Thereafter, the six clamping rollers 10 drive the substrate 1 to rotate so as to rotatably clamp the substrate 1.

Therefore, when the substrate 1 requires a specific rotation speed, the first motor 17 and second motor 18 are simultaneously driven to rotate clockwise or counterclockwise and the rotation speed of the substrate 1 is controlled by the first motor 17 and the second motor 18.

Figure 1:
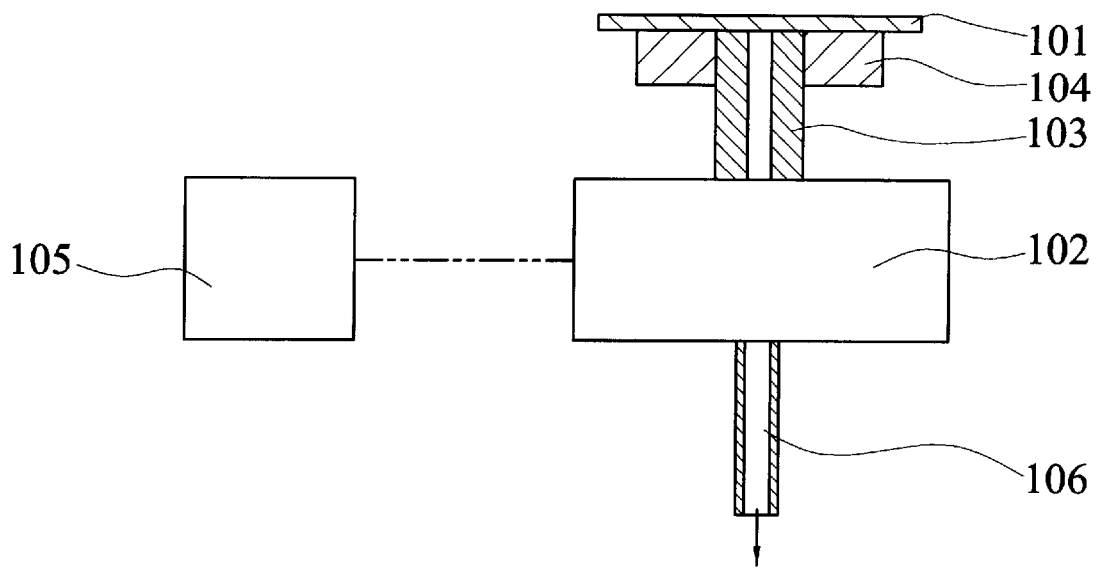
FIG. 1 is a schematic illustration showing a conventional driving device of a spin chuck.
Figure 2:
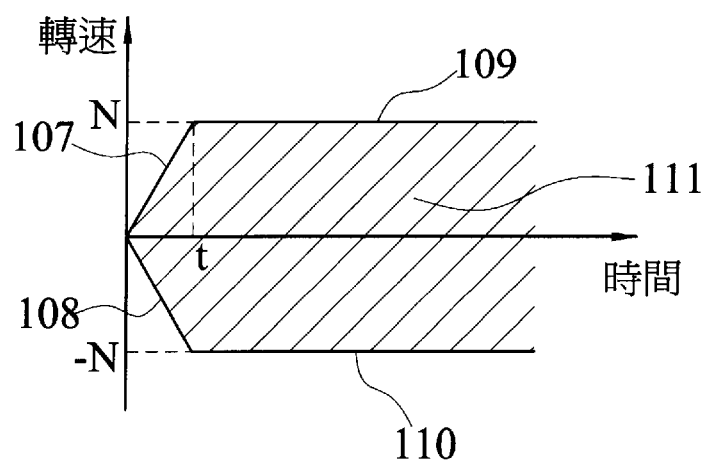
FIG. 2 is a chart illustrating the relationship between the rotation speed of a conventional substrate and time.
Figure 3B:
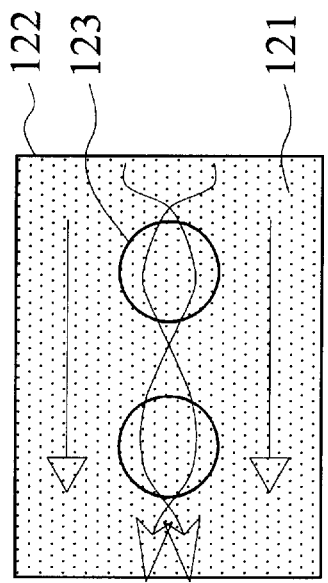
FIG. 3B is a top view illustrating a flow status of an etchant on a substrate in a conventional etching process.
Figure 3D:
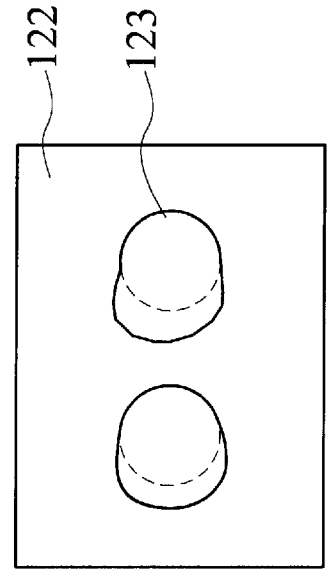
FIG. 3D is a top view illustrating the etched substrate as shown in FIG. 3B.
Figure 3A:
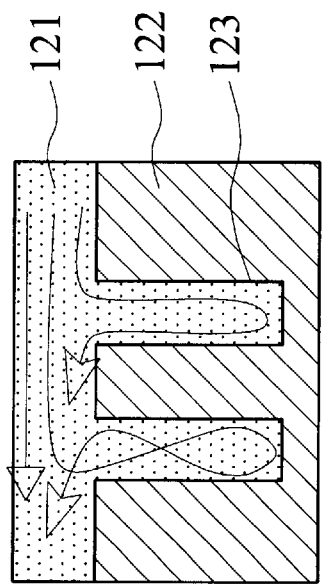
FIG. 3A is a front cross-sectional view illustrating a flow status of an etchant on a substrate in a conventional etching process.
Figure 3C:
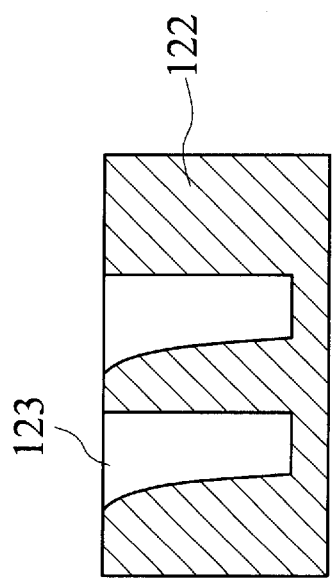
FIG. 3C is a front cross-sectional view illustrating the etched substrate as shown in FIG. 3A.
Figure 4A:
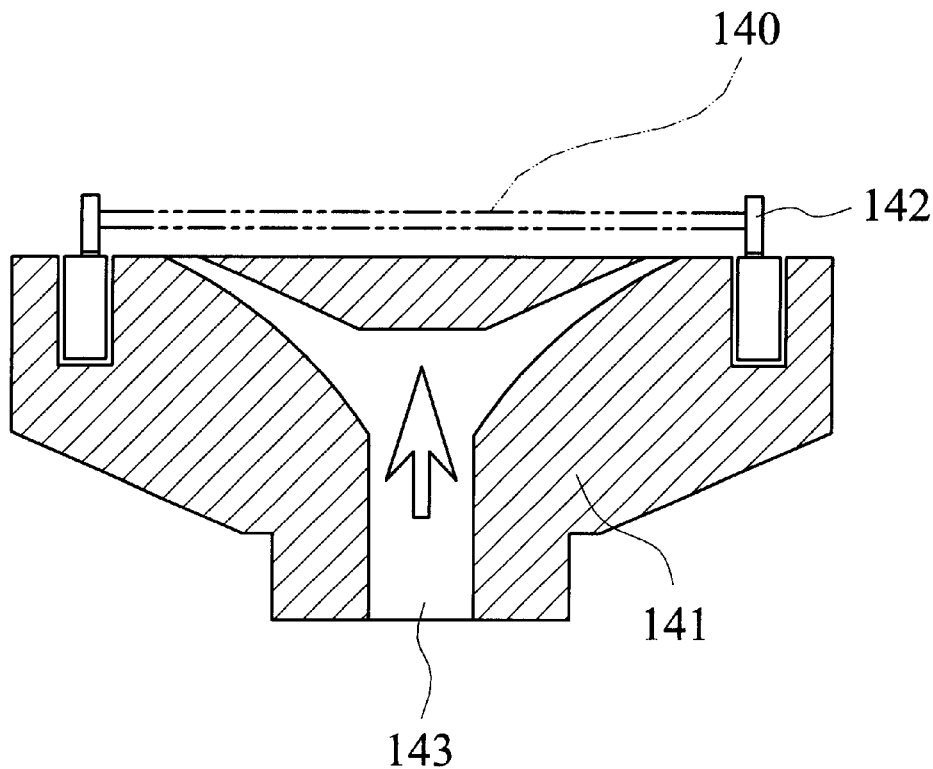
FIG. 4A is a schematic illustration showing a conventional spin chuck as disclosed in U.S. Pat. No. 5,421,056.
Figure 4B:
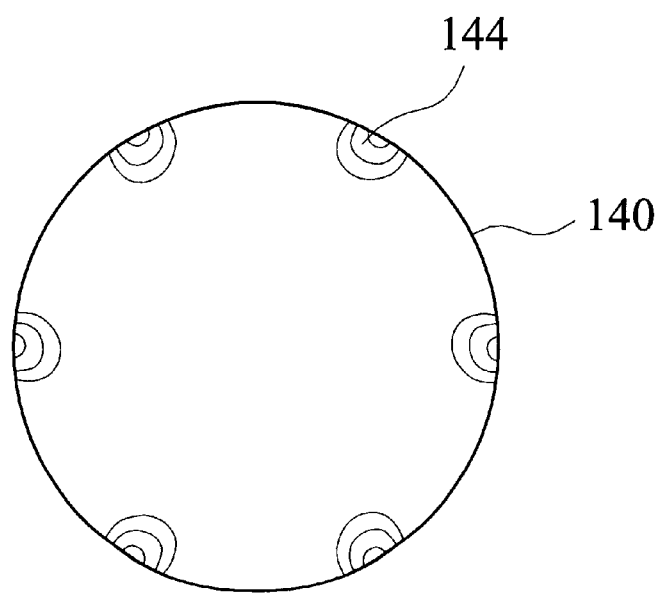
FIG. 4B is a view illustrating pin marks on the substrate caused by the spin chuck in FIG. 4A.
Figure 12:
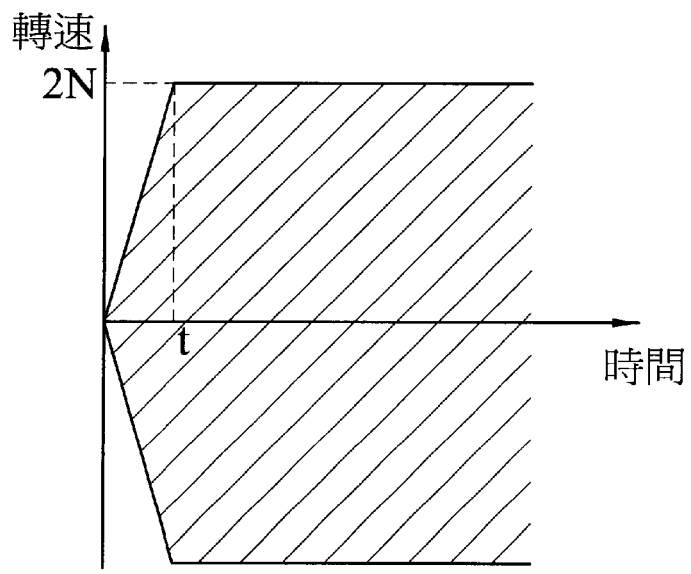
FIG. 12 is an example illustrating a relationship between the rotation speed of the substrate and time when using the spin chuck of the invention.

The effect of cooperation of the first motor 17 and the second motor 18 will be described with reference to FIG. 12. Referring to FIG. 12, the horizontal axis represents time, and the vertical axis represents the rotation speed of the substrate. Assuming that the performance of the first motor 17 and that of the second motor 18 are the same, both the maximum angular velocity and the maximum angular acceleration of the substrate 1 can be doubled in comparison with the those of the gears 1923, 1922, and 1921 in FIG. 2.

Because the centrifugal force of an object is directly proportional to the square of the object's velocity, the rotation speed of the body 2 can be maintained at, for example, 1000 rpm, and the rotation speed of the gear shaft 4 can be shifted within a range of ±10 rpm which allows the rotation speed of the substrate 1 be shifted from 990 to 1010 rpm. In the aforementioned, the processing material on the substrate 1 sustains a greater centrifugal force than from shifting the rotation speed of the substrate 1 from 10 to −10 rpm.

Since the maximum angular acceleration and the angular velocity are increased, the substrate 1 can be accelerated or decelerated suddenly.

Figure 13:
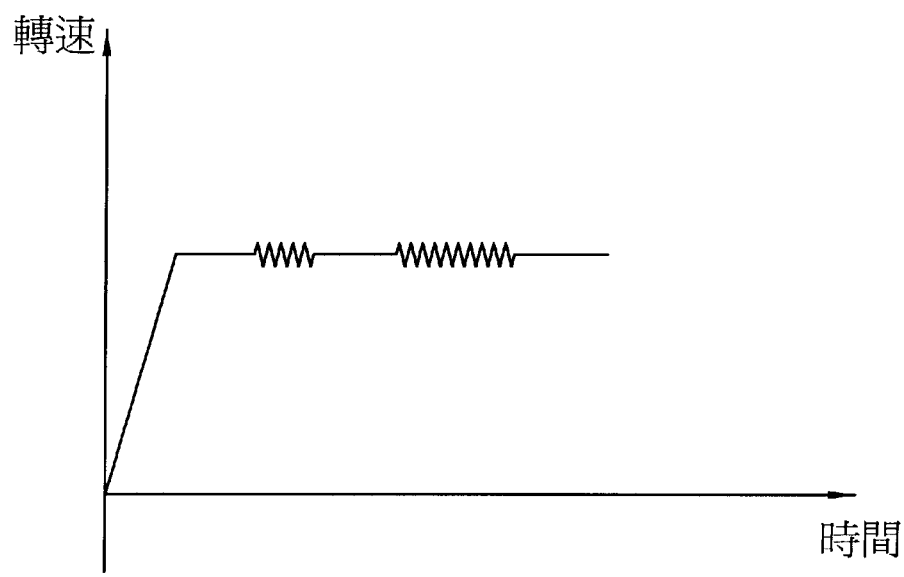
FIG. 13 is an example illustrating the shaking effect when using the spin chuck of the invention.

With the sudden acceleration and deceleration, a "shaking effect" on the substrate 1 can be obtained, as shown in FIG. 13. The "shaking effect" is advantageous in filling the trenches on the substrate 1 with the processing material.

Moreover, pin marks can be avoided and simultaneous dual-sided processing is performed since the clamping rollers 10 rotatably clamp the substrate 1. Since the body 2 is not in direct contact with the substrate 1, the heat energy generated by the motor that drives the body 2 or the gear shaft 4 can be prevented from directly transferring to the substrate and deteriorating the product.

Another embodiment of the invention will be described in the following.

Figure 14:
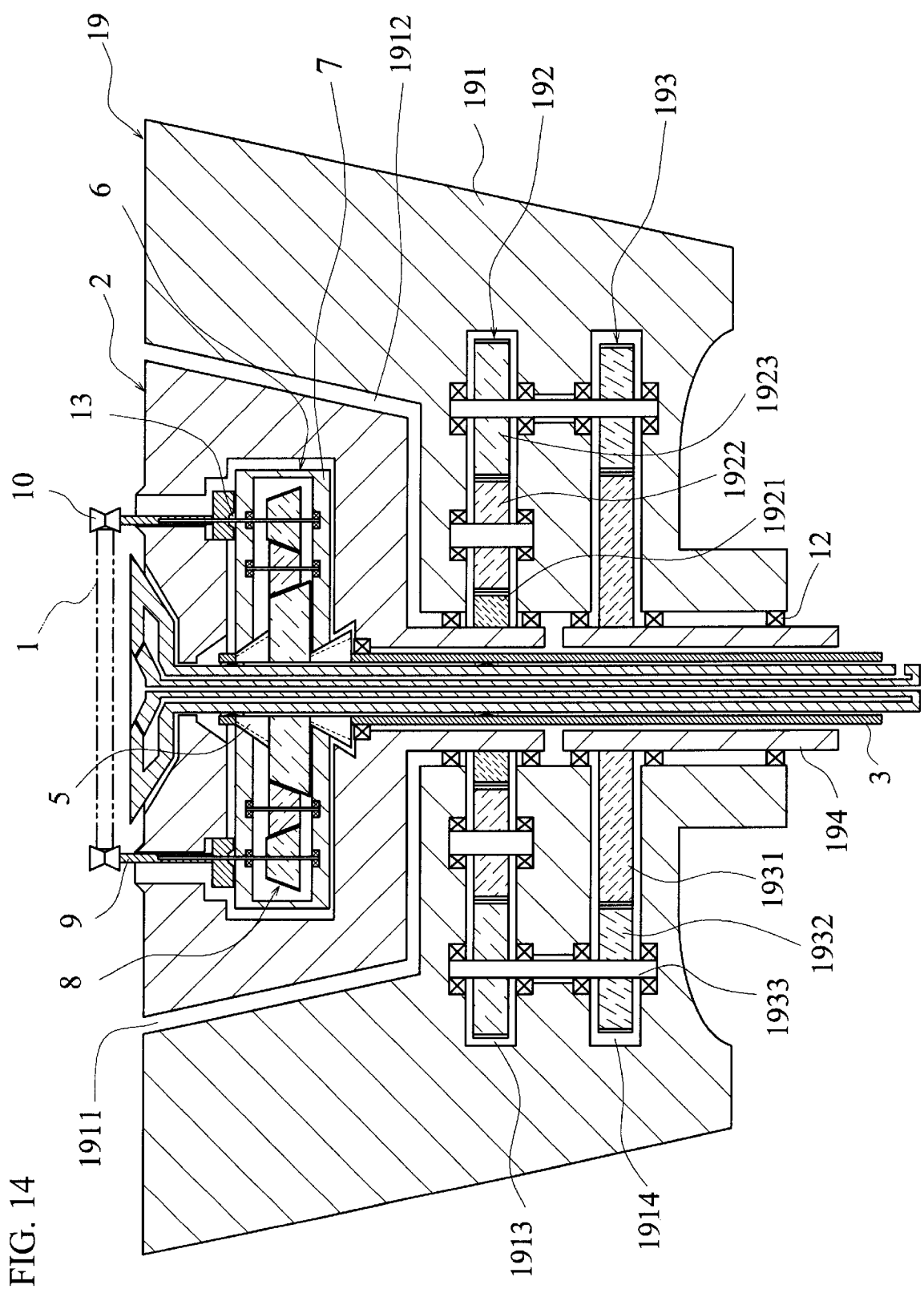
FIG. 14 is a schematic cross-sectional view illustrating a spin chuck in accordance with another embodiment of the invention.

Referring to FIG. 14, the body 2 of the spin chuck in FIG. 11 is driven to rotate by a driving device 19. The driving device 19 includes a base 191, a first planetary gear transmission mechanism 192, a second planetary gear transmission mechanism 193, and a driving shaft 194.

The base 191 has a central hole 1911 penetrating through the base 191, and first to third rooms 1912 to 1914, stacked from top to bottom, located within the base 191 and communicating with the central hole 1911. The first room 1912 is in communication with the outside and receives the body 2. The second and third rooms 1913 and 1914 communicate with the outside via the central hole 1911.

The first planetary gear transmission mechanism 192 is located in the second room 1913 and includes a sun gear 1921, three planet gears 1922, and three planet gears 1923. The sun gear 1921 is mounted to the body 2 and serves as body 2's rotating shaft. The planet gears 1922 mesh with the periphery of the sun gear 1921. The planet gears 1923 mesh with the periphery of the planet gears 1922.

The second planetary gear transmission mechanism 193 is located in the third room 1914 and includes a sun gear 1931 and three planet gears 1932 arranged around the sun gear 1931. It should be noted that each of the planet gears 1923 and a corresponding one of the planet gears 1932 are connected with a corresponding one of three rotating shafts 1933.

The driving shaft 194 is for driving the sun gear 1931 of the second planetary gear transmission mechanism 193 to rotate.

The operation of the embodiment will be described in the following. The operations of the elements within the body 2 are the same as those in FIG. 11, and detailed descriptions thereof are omitted. Thus, only the operation of the driving device 19, which drives the body 2, is described.

The base 191 and the driving shaft 194 are driven to rotate separately. When the base 191 rotates and the driving shaft 194 stops, each of the rotating shafts 1933 revolves around the input/output conduit 3 and is driven to rotate by the sun gear 1931 and the planet gears 1932. Thus, the gears 1923, 1922, and 1921 are driven to rotate. Then, the sun gear 1921 drives the body 2 to rotate.

When the base 191 halts and the driving shaft 194 rotates, the planet gears 1923, the planet gears 1922, and the sun gear 1921 are sequentially driven to rotate by the sun gear 1931, the planet gears 1932, and the rotating shaft 1933. Then, the sun gear 1921 drives the body 2 to rotate.

In the first planetary gear transmission mechanism 192 and the second planetary gear transmission mechanism 193, the rotation speed of the body 2 is controlled by the superimposition of the rotation speeds of the driving shaft 194 and the base 191. As a result, the angular velocity (acceleration) of the body 2 is controlled by adjusting the angular velocity (acceleration) of both the driving shaft 194 and the base 191. Therefore, in this case, with the accumulated angular velocities of the base 191 and the body 2, the angular velocity (acceleration) of the substrate 1 can be tripled in comparison with the gears 1923, 1922, and 1921 in FIG. 2.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

For instance, although six clamping rollers 10 are used to clamp the substrate 1 in the above embodiments, four or five clamping rollers can also be used to clamp the substrate. Moreover, although the input conduit 32 surrounds the output conduit 31, two or three input conduits can be provided around the output conduit 31 to perform the same function as described in the above embodiments.

What is claimed is:

1. A spin chuck for clamping and rotating a substrate in a chamber, said spin chuck comprising:
    at least three roller shafts;
    a planetary gear transmission mechanism coupled to said at least three roller shafts for rotating each of said at least three roller shafts separately, said planetary gear transmission mechanism including a gear shaft and an output shaft coupled to each of said at least three roller shafts, said planetary gear transmission mechanism being configured to allow said output shafts to be moved radially with respect to a central axis of said spin chuck;
    a drive means to rotate said gear shaft; and
    a clamping roller fixed on each of said at least three roller shafts and driven to rotate separately by the at least three roller shafts so as to rotatably clamp the substrate.

2. A spin chuck used for clamping a substrate to rotate in a chamber, comprising:
    a body driven to rotate by a driving device with the body having:
        a through hole penetrating through the body;
        a first space substantially perpendicularly and communicating with the through hole;
        at least three holes communicating the first space with the outside;
        a plurality of upper guiding portions communicating with the first space and located above the first space; and
        a plurality of lower guiding portions communicating with the first space and located below the first space;
    an input/output conduit penetrating through the through hole for supplying a predetermined processing material to the substrate and for allowing a predetermined processing material drain out;
    a gear shaft received in the through hole and rotatably mounted between the body and the input/output conduit;
    two conoids rotatably mounted on the gear shaft, with the two conoids removed from each other by a predetermined distance, and each of the conoids having a plurality of slanting guiding portions;
    a frame received in the body and includes a plurality of section-shaped sub-frames, with each of the sub-frames having:
        a gear-room;
        an upper sliding portion and a lower sliding portion located above and under the gear-room respectively, the upper sliding portion being shifted within the upper guiding portion, while the lower sliding portion being shifted within the lower guiding portion; and
        an upper shifting portion and a lower shifting portion located at the inner periphery of the sub-frame and running from the top to the bottom so as to be shifted within the slanting guiding portion and the frame being enlarged and reduced by the cooperation of the two conoids and the plurality of slanting guiding portions;
    a planetary gear transmission mechanism received in the gear-room, including:
        a sun gear fixed on the gear shaft between the two conoids, with the gear shaft serving as a rotating shaft;
        at least three planet gears arranged around the sun gear; and
        at least three output shafts fixed on at least three planet gears and penetrating through the frame;
    at least three roller shafts received within the gear shafts and driven to rotate by the three output shafts; and
    at least three clamping rollers mounted to the three roller shafts to rotate and rotatably clamp the substrate.

3. The spin chuck according to claim 2, wherein the body further comprises: a second space for receiving a part of the input/output conduit.

4. The spin chuck according to claim 2, wherein the input/output conduit includes:
    an output conduit penetrating through the input/output conduit;
    at least one input conduit arranged around the output conduit and having an inlet and an outlet, the inlet used for inputting a predetermined processing material, the outlet used for dispersing the predetermined processing material onto the substrate; and
    a collecting portion communicating with the output conduit and the input conduit.

5. The spin chuck according to claim 2 further comprising:
    a plurality of springs on the lower guiding portions of the body allowing the frame to reduce its size providing an assistant clamping force when clamping the substrate.

6. The spin chuck according to claim 2, wherein the driving device comprises:
    a base with a central hole penetrating through the base, and the first to third rooms located within the base running from the top to the bottom and in communication with the central hole, the first space directly communicating with the outside and receiving the body, and the second and third rooms communicating with the outside via the central hole;
    a first planetary gear transmission mechanism located within the second space, including a sun gear on the body which serves as a rotating shaft thereof, and at least one planet gear arranged around the sun gear;
    a second planetary gear transmission mechanism located within the third room, including a sun gear and at least one planet gear arranged around the sun gear, wherein an outermost planet gear of the first planetary gear transmission mechanism and a correspondingly outermost planet gear of the second planetary gear transmission mechanism are fixed on the same rotating shaft; and
    a driving shaft for driving the sun gear of the second planetary gear transmission mechanism to rotate.

* * * * *